United States Patent
Bojarczuk, Jr. et al.

(10) Patent No.: US 6,541,079 B1
(45) Date of Patent: Apr. 1, 2003

(54) ENGINEERED HIGH DIELECTRIC CONSTANT OXIDE AND OXYNITRIDE HETEROSTRUCTURE GATE DIELECTRICS BY AN ATOMIC BEAM DEPOSITION TECHNIQUE

(75) Inventors: Nestor A. Bojarczuk, Jr., Poughkeepsie, NY (US); Eduard A. Cartier, New York City, NY (US); Supratik Guha, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/426,656

(22) Filed: Oct. 25, 1999

(51) Int. Cl.$^7$ ................................................ C23C 14/08
(52) U.S. Cl. ........................ 427/527; 427/529; 427/530; 427/255.29; 427/255.394
(58) Field of Search ........................ 427/255.34, 255.36, 427/255.37, 255.29, 255.393, 255.394, 527, 529, 530

(56) References Cited

U.S. PATENT DOCUMENTS

| | | | |
|---|---|---|---|
| 4,717,631 A | * | 1/1988 | Kaganowicz et al. .. 427/255.394 |
| 4,800,100 A | * | 1/1989 | Herbots et al. ....... 427/255.394 |
| 4,927,670 A | * | 5/1990 | Erbil ..................... 427/255.19 |
| 5,225,031 A | * | 7/1993 | McKee et al. ......... 427/255.19 |
| 5,397,957 A | * | 3/1995 | Zimmerman ............. 427/126.4 |
| 5,501,175 A | * | 3/1996 | Tanaka et al. ............... 427/595 |
| 5,622,918 A | * | 4/1997 | Nakamura ..................... 427/62 |
| 5,627,142 A | * | 5/1997 | Yamada et al. ................ 427/62 |
| 5,667,586 A | * | 9/1997 | Ek et al. ......................... 117/90 |

* cited by examiner

*Primary Examiner*—Bret Chen
(74) *Attorney, Agent, or Firm*—Thomas A. Beck; Casey August

(57) ABSTRACT

A method of forming a layer of oxide or oxynitride upon a substrate including first placing a substrate having an upper surface and a lower surface in a high vacuum chamber and then exposing the upper surface to a beam of atoms or molecules, or both, of oxygen or nitrogen or a combination of same at a temperature sufficient to form a reacted layer on the upper surface of said substrate wherein said layer has a chemical composition different from the chemical composition of said substrate. The reacted upper layer is then exposed simultaneously in the chamber to atomic or molecular beams of oxygen, nitrogen or both and to a beam of metal atoms or metal molecules selected from the group consisting of Al, Si, Zr, La, Y, Sc, Sr, Ba, Ti, Ta, W, Cr, Zr, Ca, Mg, Be, Pr, Nd and Hf to form a metal oxide, a metal nitride or a metal oxynitride layer in said layer. Another option is to expose the upper surface of the substrate simultaneously in the chamber to atomic or molecular beams of oxygen, nitrogen or both and to a beam of metal atoms or meal molecules selected from the group consisting of Al, Si, Zr, La Y, Sc, Sr, Ba, Ti, Ta, W, Cr, Zr, Ca, Mg, Be, Pr, Nd and Hf to form a metal oxide, a metal nitride or a metal oxynitride layer on said reacted layer.

9 Claims, 1 Drawing Sheet

ENGINEERED HIGH DIELECTRIC CONSTANT OXIDE AND OXYNITRIDE HETEROSTRUCTURE GATE DIELECTRICS BY AN ATOMIC BEAM DEPOSITION TECHNIQUE

BACKGROUND OF THE INVENTION

1. Field of the Invention

The present invention relates to the production of ultrathin layers of amorphous metal oxides and oxide heterostructures for use as dielectric insulators comprising the use of a reactive atomic or molecular beam concurrent oxidation and deposition technique.

2. Brief Description of the Prior Art

There is a need for ultrathin amorphous oxides and oxide heterostructures for use as dielectric insulators. One of the major applications of such oxides are as new gate dielectrics for Si CMOS technology as a replacement for $SiO_2$ based gate dielectrics which become less attractive with the sing dimensions of CMOS scaling. Such new gate dielectrics will need to be insulating with low leakage currents, should have a high dielectric constant, should be robust and inert to the environments of the CMOS process conditions and should be non-reactive with Si. One should be able to make such thin films as heterostructures in multilayer form (with thicknesses at the atomic or molecular dimensions) and should also be able to dope them with other elements in order to enhance dielectric constants as well as to maintain an amorphous structure. In other words, one should be able to deliberately engineer such layers with chemical composition and microstructural modulations at atomic or molecular layer level thicknesses. What the alternative gate dielectric for the future will be is not known at the present, though there are several candidate materials. It is reasonable to expect that such a material will be an oxide. What is needed is a technique for depositing such oxide layers in a pure fashion from low to high temperatures with atomic or molecular layer thickness controls. Such oxides may also be useful in novel device structures requiring processing at low temperatures.

In the past, aluminum oxide films have been deposited by techniques such as conventional sputtering and chemical vapor deposition. Conventional sputtering results in ion damage. In addition, it is difficult to prevent or deliberately control the formation of an intermediate silicon oxide layer. Chemical vapor deposition techniques contain hydrogen environments and therefore can result in the formation of aluminum hydroxides. These hydroxides are unstable above 400° C. and convert to oxides, resulting in microstructural changes in the film. The atomic or molecular beam deposition technique described herein bypasses the above-noted problems, and results in the purest, most controllable deposition possible. The present invention provides a unique undoped or doped film grown by the atomic or molecular beam deposition technique.

Other objects and features as well as additional details of the present invention will become apparent from the following detailed description and annexed drawings of the presently preferred embodiments thereof, when considered in conjunction with the drawings.

SUMMARY OF THE INVENTION

The present invention demonstrates the production of ultrathin layers of metal oxides and oxide heterostructures for use as dielectric insulators comprising the use of a reactive atomic or molecular beam concurrent oxidation and deposition technique. In accordance with the method, the sample is held in an ultra high vacuum deposition chamber and faces an atomic or molecular beam source of oxygen and elemental evaporation sources. The growth of an oxide is accomplished by evaporating the elemental constituents in the presence of the atomic or molecular oxygen beam. The resultant thin film deposited thereupon is an oxide compound of the elemental evaporants. For example, if the evaporated elements are A, B and C, the deposited thin films will have the chemical composition $A_xB_yC_dO_y$. Since highly reactive oxygen can be used as a source material, an elevated temperature is not necessary for oxidation, and the oxide deposition may be carried out to temperatures below room temperature, (less than about 30° C. up to about 1000° C.). This is an advantage of the technique. Additionally, the same atomic or molecular oxygen source can also be used to oxidize the Si surface for the formation of an interfacial $SiO_2$, if necessary, again at any convenient temperature. The convenient temperature noted and the atomic and molecular oxygen source allow $SiO_2$ layer formation with controllable thickness. Since the evaporants can be varied and the evaporation sources can be shuttered, abrupt multilayered oxides with different chemical compositions may be formed with thicknesses controllable to one monolayer. Finally the technique of the present invention lends itself very easily to the formation of doped oxides, by simple evaporation of the dopant. The process is depicted in FIG. 1.

In summary, the deposition obtained in the present invention occurs by delivery of a metal flux or vapor onto the substrate surface. In the presence of an oxygen beam the metal oxidizes as it is deposited. The process of the present invention is thus one where a layer of metal is oxidized, either thermally or by an oxygen rf beam, and then buried below as a fresh layer of metal is deposited over it, and in turn is oxidized as well. This is accomplished by having a molecular or rf discharge excited oxygen beam turned at all times towards the substrate, with the metal being continuously evaporated at a slow rate in conjunction; or alternatively, the metal and oxygen beams are sequentially shuttered toward the substrate.

The present, invention has taken the concept of a molecular or atomic beam with directionality as it impinges upon the substrate and uses the beam of oxygen for oxidation of an elemental metal as it is deposited upon the substrate.

The method of the present invention provides four benefits: (i) precisely controlled deposition of amorphous multilayers in a clean ultra high vacuum environment; (ii) low temperature deposition leveraged by the ability to use atomic oxygen; (iii) ease of doping films; (iv) the ability to tailor the chemical composition of the upper surface of the silicon substrate prior to deposition by deliberate exposure of the surface to an oxygen beam at any convenient temperature.

The deposition technique of the present invention derives from well known molecular beam epitaxy technique, where single crystal epitaxial films are grown at high temperatures on substrates. Optionally, the atomic oxygen source is a commercial radio frequency source; however, the desired oxide may be formed (grown) using only a molecular oxygen flow. The pure environment insures a carefully controlled interface between the layers without the presence of unintentional contaminants and chemical layers.

Thus, while there have been shown and described and pointed out fundamental novel features of the invention as applied to currently preferred embodiments thereof, it will be understood that various omissions and substitutions and changes in the form and details of the method and apparatus illustrated, and in their operation, may be made by those skilled in the art without departing from the spirit of the invention. In addition it is to be understood that the drawings are not necessarily drawn to scale but that they are merely conceptual in nature. It is the intention, therefore, to be limited only as indicated by the scope of the claims appended herewith.

DETAILED DESCRIPTION OF THE PREFERRED EMBODIMENT

Figure 1:
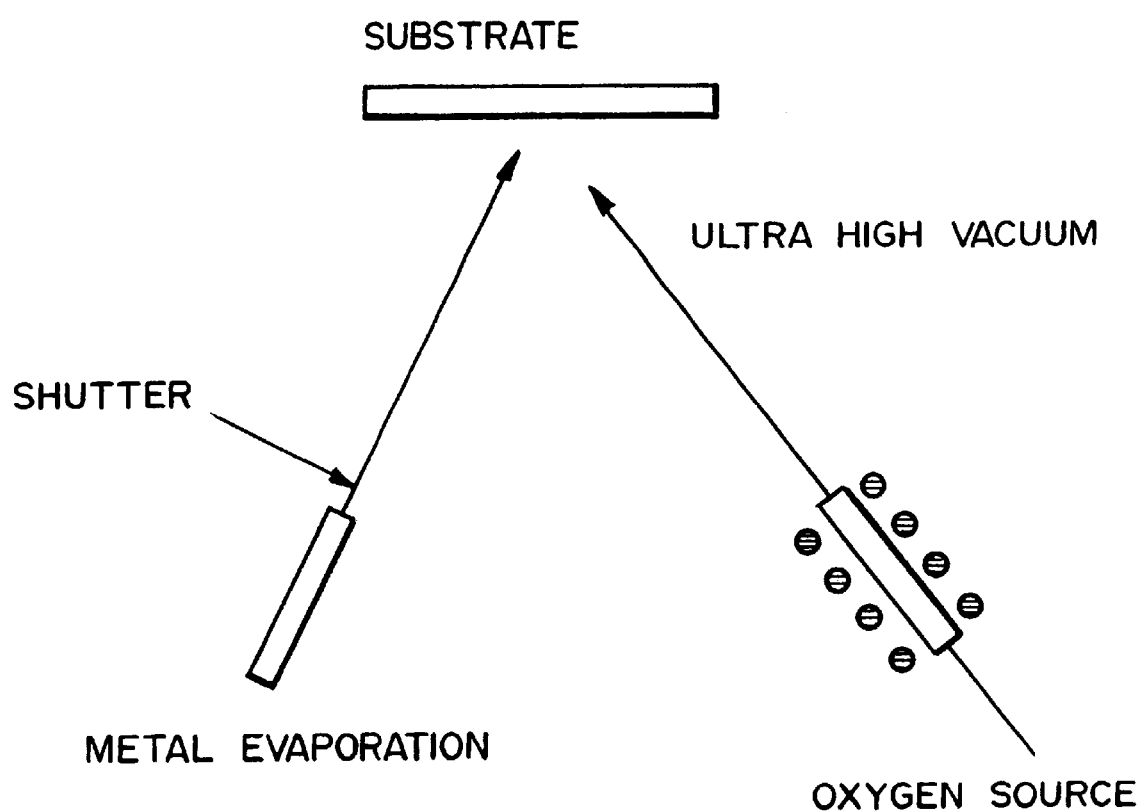
FIG. 1 is a schematic drawing of the deposition process.

The process of the present invention comprises forming an oxide or oxynitride layer on the surface of a substrate. The steps involved include initially placing the substrate in a high vacuum chamber and bombarding the surface of the substrate with a beam of atoms of oxygen or nitrogen. For the purpose of this invention, the term "bombardment" means subjecting the upper surface of the substrate to a beam of atoms or molecules at any level of kinetic energy. During the aforementioned step, one or more of the elements comprising Al, Si, Zr, La, Y, Sc, Sr, Ba, Ti, Ta, W, Cr, Zr, Ca, Mg, Be, Pr, Nd and Hf is evaporated in the vacuum chamber and is concurrently or sequentially contacted with the substrate surface.

In the specific procedure followed, two inch diameter Si (100) oriented wafers were cleaned via standard RCA cleaning techniques, followed by dipping in HF:$H_2O$ (1:10) for about 45 seconds to 3 minutes. This produced a hydrophobic Si surface, following which the wafers were loaded into a vacuum chamber and vacuum outgased at 200° C. to release moisture. The samples were then transferred to the atomic beam deposition chamber without breaking vacuum. As shown in FIG. 1, this chamber 1 is equipped with a radio frequency (rf) oxygen source 2 (from Oxford Applied Research) and the source is excited by passing about 0.5 to 1 sccm of $O_2$ through it and striking a radio frequency discharge. Operating power was about 350 to 400 watts. This results in the generation of an excited oxygen beam containing oxygen atoms. An aluminum source to be used in the process was heated to between about 950° C. and 1000° C. using a standard resistively heated effusion source.

The deposition chamber is an ultra high vacuum chamber, and the operating pressures are low enough to enable and allow one to define directional molecular/atomic beams of oxygen and aluminum directed at the substrate.

The Si wafer was then heated to from about 350° C. to about 650° C. Additional experiments were conducted with the Si wafer kept at room temperature. The sample was then rotated toward the aluminum and oxygen sources. The growth of a thin film of aluminum oxide ensued, initiated by exposing the substrate surface to the oxygen and aluminum atomic beams. The atomic beams impinged on the surface and react to form a thin film of aluminum oxide. Typical growth rates were from about 30 nm/hr to about 60 nm/hr and can be adjusted by adjusting the Al effusion cell temperature. Growth at temperatures of 350° C. and below resulted in an amorphous aluminum oxide microstructure as observed by x-ray diffraction and transmission electron microscopy characterization. The interface between the oxide and the Si was free of any interfacial layers as deduced from high resolution transmission electron microscopy.

The structure grown above consisted of aluminum oxide grown directly on Si; i.e., the demonstration was of a single oxide layer on Si. An interfacial layer of silicon oxide ($SiO_x$) was deliberately inserted in the following manner resulting in the formation of a bilayer.

Prior to aluminum oxide growth, the substrate, at 350° C., (conveniently 100° C. to 500° C. was exposed to the oxygen beam and the aluminum cell was shuttered off. Due to the highly reactive nature of the oxygen beam, the surface of the Si oxidizes forming $SiO_x$. Aluminum oxide growth was then initiated by opening up the aluminum effusion cell and proceeding as described above. This resulted in an interlayer of $SiO_x$ that was about 1 nm thick, and sandwiched between the Si and Al layers, as evidenced from high resolution transmission electron microscopy observations. Atomic force microscopy of the surface showed smooth films with rms roughness that is about 2% of the thickness of the film.

Aluminum oxide films may also be doped by coevaporating a different element along with the Al, in a different effusion cell. For example, La or Ti may be evaporated by heating them to about 1200° C. to about 1600° C. In this fashion the resulting film will contain small amounts of La or Ti. This combination results in a pronounced enhancement of the dielectric constant. In the present invention a preferred embodiment is an insulator of $Al_2O_3$ that is doped with La.

Aluminum oxide films may also be formed by using a molecular beam of oxygen molecules directed at the substrate with the radio frequency turned off. This procedure works with metals highly susceptible to oxidation (such as Al), but may not work with other elements where rf excitation may be necessary.

After growth, the samples are subjected to a forming gas anneal in a mixture of 10% hydrogen and 90% nitrogen at 550° C. for 30 minutes to passivate the $Al_2O_3$/silicon substrate interface. Then, thermal evaporation through a shadow mask is used to define circular capacitors on the n-type silicon substrates with an area of 0.005 $cm^2$. The evaporated metal was aluminum. High frequency and quasi-static capacitance-voltage measurements are used to determine the interface state density at the $Al_2O_3$/Si substrate interface. Using these measurements, an upper limit for the interface state density of about $5 \times 10^{10}$ per $cm^2$ has been established. This value is low enough to fabricate high quality electronic devices. The same capacitors are also used to measure the leakage current. A direct comparison of the measured leakage currents through such films with values measured on capacitors with $SiO_2$ films of the same electrical thickness (i.e., the same accumulation capacitance) shows a dramatic reduction in the leakage current by 4 to 5 orders of magnitude if measured 1 volt above the flat band voltage which is found to be close to zero volts. These observations are consistently made on capacitors with $SiO_2$ equivalent electrical thicknesses ranging from between about 1.5 nm to about 3 nm, demonstrating the potential use as a gate insulator.

Thus, while there have been shown and described and pointed out fundamental novel features of the invention as applied to currently preferred embodiments thereof, it will be understood that various omissions and substitutions and changes in the form and details of the method and apparatus illustrated, and in their operation, may be made by those skilled in the art without departing from the spirit of the invention. In addition it is to be understood that the drawings are not necessarily drawn to scale but that they are merely conceptual in nature. It is the intention, therefore, to be limited only as indicated by the scope of the claims appended herewith.

What we claim and desire to protect by Letters Patent is:

1. A method of forming a layer of metal oxide, metal nitride or metal oxynitride upon a substrate comprising the steps of:
   a) placing a substrate having an upper surface and a lower surface in a chamber having an ultra high vacuum pressure;
   b) exposing said upper surface to a beam of atoms of oxygen or nitrogen or a combination of same at an ultra-high vacuum pressure and at a temperature sufficient to form a reacted layer comprising a reaction product of said atomic beam and said substrate on said upper surface of said substrate wherein said reacted layer has a chemical composition different from the chemical composition of said substrate.

2. The method of forming said layer of metal oxide, metal nitride or metal oxynitride upon said substrate defined in claim 1 wherein said formed reacted upper layer is then exposed simultaneously in said chamber to atomic beams of oxygen, nitrogen or both and to a beam of metal atoms or metal molecules selected from the group consisting of Al, Si, Zr, La Y, Sc, Sr, Ba, Ti, Ta, W, Cr, Zr, Ca, Mg, Be, Pr, Nd and Hf to form a reaction product comprising a metal oxide, a metal nitride, or a metal oxynitride layer on said reacted layer.

3. The method of forming said layers upon said substrate defined in claim 2 wherein said layer comprise a gate oxide of an Field Effect Transistor (FET) having a dielectric constant of between about 12 and about 20.

4. The method of forming said layer upon said substrate defined in claim 3 wherein said high dielectric constant gate oxide is $Al_2O_3$ or mixtures of $Al_2O_3$ and oxides of Si, Zr, La, Y, Sc, Sr, Ba, Ti, Ta, W, Cr, Zr, Ca, Mg, Be, Pr, Nd and Hf.

5. The method of forming said layer upon said substrate defined in claim 1 wherein said substrate is silicon.

6. A method of forming a layer of metal oxide metal nitride or metal oxynitride upon a substrate comprising the steps of:
   a) placing a substrate having an upper surface and a lower surface in an ultra high vacuum chamber;
   b) exposing said upper surface in said ultra high vacuum chamber simultaneously to atomic beams of oxygen, nitrogen or both and to a beam of metal atoms or metal molecules selected from the group consisting of Al, Si, Zr, La Y, Sc, Sr, Ba, Ti, Ta, W, Cr, Zr, Ca, Mg, Be, Pr, Nd and Hf to form a metal oxide, a metal nitride or a metal oxynitride reaction product layer on said substrate.

7. The method of forming said layer upon said substrate defined in claim 6 wherein said layer is a gate oxide of an FET having a high dielectric constant.

8. The method of forming said layer upon said substrate defined in claim 7 wherein said high dielectric constant gate oxide is $Al_2O_3$ or mixtures of $Al_2O_3$ and oxides of Si, Zr, La, Y, Sc, Sr, Ba, Ti, Ta, W, Cr, Zr, Ca, Mg, Be, Pr, Nd and Hf.

9. The method of forming said layer upon said substrate defined in claim 6 wherein said substrate is silicon.

* * * * *